United States Patent [19]
Grivna

[11] Patent Number: 5,888,901
[45] Date of Patent: Mar. 30, 1999

[54] MULTILEVEL INTERCONNECTION AND METHOD FOR MAKING

[75] Inventor: Gordon M. Grivna, Mesa, Ariz.

[73] Assignee: Motorola, Inc., Schaumburg, Ill.

[21] Appl. No.: 691,967

[22] Filed: Aug. 5, 1996

[51] Int. Cl.$^6$ .................................................... H01L 21/469
[52] U.S. Cl. .......................... 438/637; 438/723; 438/700; 438/713; 438/640
[58] Field of Search .................................... 438/637, 645, 438/723, 759, 700, 701, 706, 710, 713, 727, 728, 690, 640

[56] References Cited

U.S. PATENT DOCUMENTS

| | | |
|---|---|---|
| 4,641,420 | 2/1987 | Lee . |
| 4,690,746 | 9/1987 | McInerney et al. . |
| 5,089,442 | 2/1992 | Olmer . |
| 5,203,957 | 4/1993 | Yoo et al. . |
| 5,269,880 | 12/1993 | Jolly et al. . |
| 5,453,403 | 9/1995 | Meng et al. . |
| 5,460,689 | 10/1995 | Raaijmakesr et al. . |
| 5,560,802 | 10/1996 | Chisholm . |
| 5,707,486 | 1/1998 | Collins . |

OTHER PUBLICATIONS

R. Iyer, "Reactive Facet Sputtering of $SiO_2$", J. Electrochem. Soc., vol. 141, No. 11, Nov. 1994, pp. 3151–3153.

Chisato Hashimoto et al., "New taper–etching technology using oxygen ion plasma", J. Vac. Sci. Technol., vol. 8, No. 3, May/Jun. 1990, pp. 529–532.

H. Kotani et al., "Sputter–Etching Planarization for Multi-level Metallization", J. Electrochem Soc.: Solid–State Science and Technology, vol. 130, No. 3, Mar. 1983, pp. 645–648.

*Primary Examiner*—Caridad Everhart
*Attorney, Agent, or Firm*—Robert F. Hightower; Gary Hoshizaki

[57] ABSTRACT

A structure and a method for connecting multiple interconnect layers on an integrated circuit structure (10) using landed or non-landed vias. An integrated circuit structure (10) has an interconnect trace (11) formed over a surface. A dielectric layer (13) is formed over the integrated circuit structure (10) and a photoresist layer (14) having an opening in the area where a via is desired is formed on the dielectric layer (13). The dielectric layer (13) is isotropically etched in an upper portion (16) through the opening in the photoresist layer (14) and then anisotropically etched to expose the interconnect trace (11). The photoresist layer (14) is removed and the dielectric layer (13) subjected to a high pressure sputter etch for smoothing the surfaces of the via opening and for filling voids (18) in the dielectric layer (13).

17 Claims, 3 Drawing Sheets

MULTILEVEL INTERCONNECTION AND METHOD FOR MAKING

BACKGROUND OF THE INVENTION

The present invention relates in general to integrated circuits and, more particularly, to multilevel interconnections on integrated circuits.

Many semiconductor devices are fabricated using more than one layer of interconnect metallization. For example, integrated circuits commonly have multiple interconnect layers, wherein an underlying interconnect layer is separated from a subsequent interconnect layer by a dielectric layer formed between them. Via openings are made in the dielectric layer to expose the underlying interconnect layer so it can be contacted by the subsequent interconnect layer.

Multilevel metallization structures typically use landed vias to provide contact between metal layers. A landed via is one in which the underlying metal trace is flared out or "dog-boned" around the via such that even if the via is misaligned it will lie completely over the underlying metal trace, whereas a nonlanded via is one which lies over an edge of an underlying metal trace. Landed vias are commonly used because the metal region acts as a natural etch stop to the via etch process. However, landed vias have a disadvantage of reducing the interconnect density because the "dog-bone" feature, rather than the metal line itself, defines the minimum space between lines.

Nonlanded vias increase interconnect density but they are more difficult to fabricate because the metal trace does not act as an etch stop. As a result, a more complex via process is used in order to prevent voids from being formed in the dielectric layer when the via openings are overetched. Such voids often result in reliability failures in the integrated circuit. A previously known method fills the voids using a complex chemical vapor deposition process. However, this method requires multiple processing steps which adds substantial cost to the fabrication of the integrated circuit. Another known method uses titanium as a wetting agent to assist in the extrusion of metal from a subsequent interconnect layer to fill the voids. However, this method requires special equipment which also increases the integrated circuit manufacturing cost.

Hence, there is a need for a method for forming via openings which does not reduce the density of the underlying metal layer by using a flared metal trace to provide an etch stop for the via etch process. It would be a benefit if the via opening could be formed at low cost using a simple process which does not require special equipment.

DETAILED DESCRIPTION OF THE DRAWINGS

Figure 1:
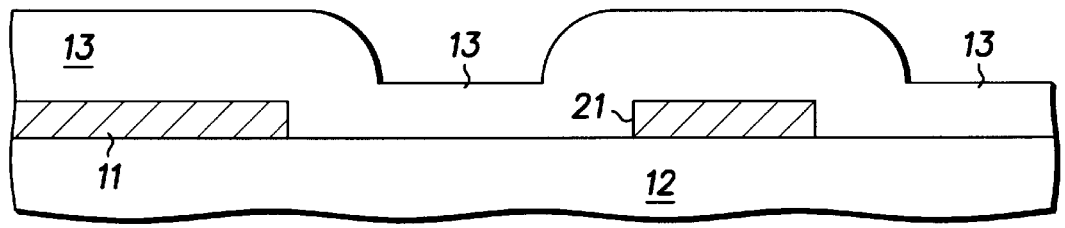
FIG. 1 is a cross-sectional view of a portion of an integrated circuit structure in accordance with the present invention.

FIG. 1 is a cross-sectional view of a portion of an integrated circuit structure 10 in accordance with the present invention. Integrated circuit structure 10 comprises a substrate 12, interconnect traces 11 and 21 which comprise an interconnect layer, and a dielectric layer 13. Substrate 12 is preferably a semiconductor substrate comprised of silicon or another semiconductor material. Interconnect traces 11 and 21 are formed on a surface of substrate 12 and are comprised of a conductive material which is typically a metal such as, for example, aluminum or a copper-aluminum alloy.

Prior methods for forming a via opening generally require an initial planarization step prior to forming dielectric layer 13. The present invention improves on prior methods by eliminating the requirement for this initial planarization step. However, dielectric layer 13 should be formed so as to cover interconnect traces 11 and 21 to a uniform thickness. The uniform thickness of dielectric layer 13 is preferably maintained, so that after dielectric layer 13 is formed, a planarizing step is not desirable if it results in significant thickness variations over interconnect traces 11 and 21.

Dielectric layer 13 is commonly formed from an insulating material such as silicon dioxide. In the embodiment described herein, dielectric layer 13 is described as a silicon dioxide layer of uniform composition. However, one skilled in the art would alternatively be able to form a nonhomogeneous dielectric layer 13 or one comprising a different material. For example, all or a portion of dielectric layer 13 could be formed using silicon nitride. While such alternative embodiments may result in adaptations of particular processing steps described herein, they should be considered to fall within the scope and spirit of the present invention.

Although the thickness of dielectric layer 13 should be uniform over interconnect traces 11 and 21, thickness variations can be expected between wafer lots which are processed at different times. A practical range for the thickness of dielectric layer 13 is typically between 8,000 and 12,000 Angstroms, with a nominal thickness of 10,000 Angstroms. Within a single wafer, the dielectric thickness variation between interconnect traces 11 and 21 is preferably less than ten percent.

Figure 2:
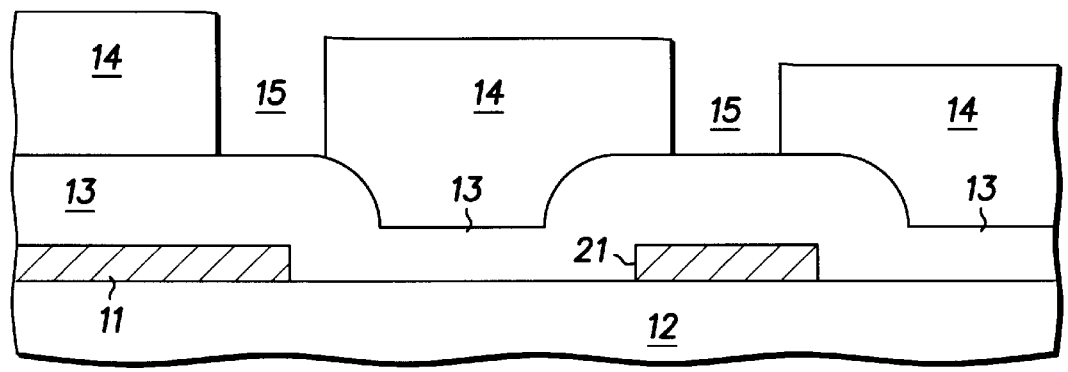
FIG. 2 is a cross-sectional view showing a patterned photoresist layer formed over a dielectric layer in accordance with the present invention.

FIG. 2 is a cross-sectional view showing a patterned photoresist layer 14 formed over dielectric layer 13 in accordance with the present invention. Resist layer 14 is also known as a photoresist layer. Openings 15 in resist layer 14 are patterned with a photomask in a conventional manner. Each opening 15 is formed in the area where a via opening is desired. In accordance with the present invention, it is not necessary to "dog-bone" the regions of interconnect traces 11 and 21 which lie under the via openings. Thus, either a landed via opening, which is formed over interconnect trace 21, or a non-landed via opening, which is formed over interconnect trace 11, can be formed using the method of the present invention.

Figure 3:
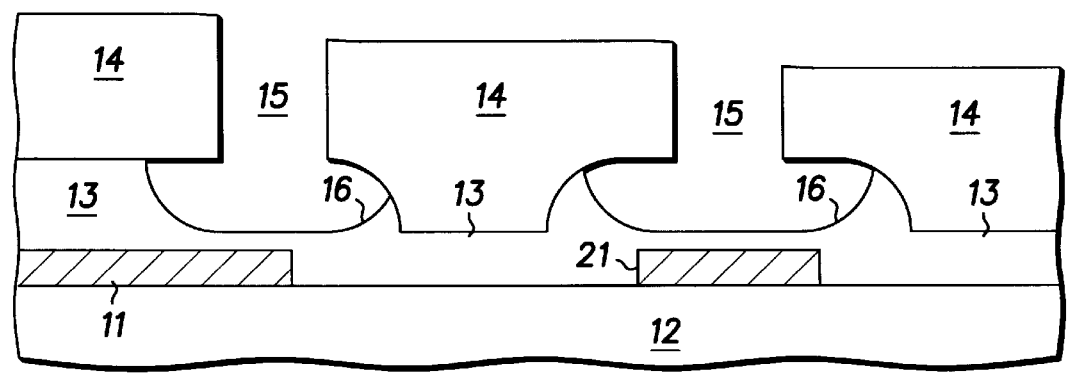
FIG. 3 is a cross-sectional view of an integrated circuit structure after an isotropic flare etching step in accordance with the present invention.

FIG. 3 is a cross-sectional view of integrated circuit structure 10 after an isotropic flare etching step in accordance with the present invention. Dielectric layer 13 is isotropically etched in the regions exposed by openings 15 in resist layer 14. The flare etching step produces a tapered profile in upper portion 16 of the via opening in dielectric layer 13. Upper portion 16 flares out or undercuts resist layer 14 to form a smoother transition from the horizontal surface of dielectric layer 13 than could be obtained with a vertical anisotropic etch. The isotropic flare etching step typically removes a thickness portion of dielectric layer 13 such that upper portion 16 has a depth of about 6,500 Angstroms, with approximately 3,500 Angstroms of silicon dioxide remaining unetched. The flare etching step can be performed using either a wet etch process or a dry etch process such as a plasma etch. In either case, the flare etching step is commonly performed using a fluorine-based etchant.

Isotropic etching is used for the flare etching step in order to bevel the sidewalls of upper portion 16 of the via openings formed under openings 15. Whereas an anisotropic etch would create a steep sidewall which would cause a thinning of the subsequent metal layer over the edge of the via opening, isotropic etching smoothes the transition from the top surface of dielectric layer 13 into upper portion 16 of the via opening which increases step coverage and reliability of a metal layer formed over the transition. For heated metal deposition, tapering in upper portion 16 also enhances flow of the subsequent metal layer into the via opening by providing a contour which reduces surface tension of the subsequent metal layer.

Figure 4:
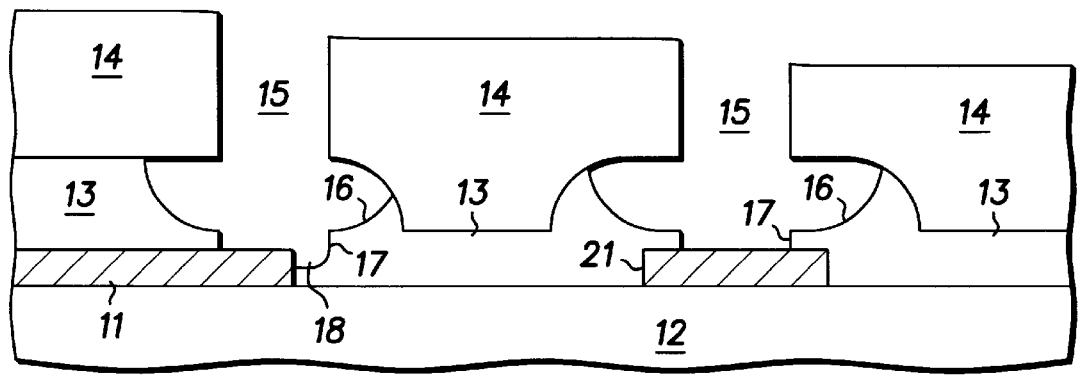
FIG. 4 is a cross-sectional view of an integrated circuit structure after an anisotropic etching step in accordance with the present invention.

FIG. 4 is a cross-sectional view of integrated circuit structure 10 after an anisotropic etching step is performed in accordance with the present invention. Using resist layer 14 as a mask, a vertical portion 17 of dielectric layer 13 is removed using an anisotropic etch process such as a reactive ion etch process. Vertical portion 17 extends from upper portion 16 through dielectric layer 13 to interconnect traces 11 and 21, thereby exposing the upper surface of interconnect traces 11 and 21 through the via opening.

In order to account for expected variations in the deposition thickness of dielectric layer 13 as well as for variations in etch rates and other processing steps, the anisotropic etching step is designed to completely etch through dielectric layer 13 to ensure that the silicon dioxide is completely removed down to the upper surfaces of interconnect traces 11 and 21. Interconnect traces 11 and 21 provide an etch stop because the reactive ion etch is selective, removing silicon dioxide at a faster rate than aluminum. Thus, interconnect traces 11 and 21 are not etched away during the anisotropic etching step.

In order to provide an adequate processing margin to ensure that the via is completely opened and the upper surfaces of interconnect traces 11 and 21 are exposed, the time for the anisotropic etching step is such that oxide is removed to a depth below the upper surfaces of interconnect trace 11. Thus, where a non-landed via is desired, such as over interconnect trace 11, voids 18 are produced in dielectric layer 13 at the perimeter of interconnect trace 11 and extending to a depth below the top surface of interconnect trace 11. Such voids 18 can result in reliability failures. Previously known methods either do not allow non-landed vias or they must provide for filling them.

One conventional method for filling voids 18 is a chemical vapor deposition (CVD) process which uses a tungsten plug to fill void 18. CVD chemistry is a diffusion limited deposition rather than a physical deposition and more readily fills narrow features. Prior to CVD tungsten deposition, a barrier layer is sputter deposited onto the wafer and into the via openings to protect aluminum interconnect traces from being etched by the CVD chemistry. Another known method extrudes the aluminum into the via openings by using a titanium layer as a wetting agent to reduce the surface tension of the aluminum. Under high pressure and high heat, the aluminum flows into and fills void 18. However, both of these methods require several processing steps and often costly special equipment.

Figure 5:
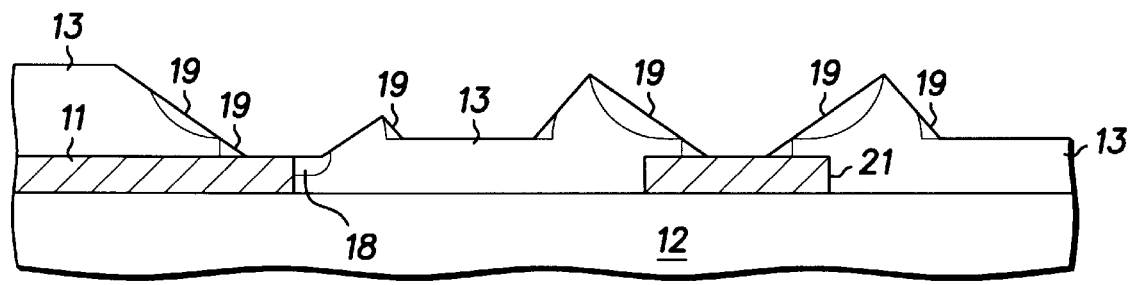
FIG. 5 is a cross-sectional view of an integrated circuit structure after a high pressure sputter etching step is performed in accordance with the present invention.

FIG. 5 is a cross-sectional view of integrated circuit structure 10 after a high pressure sputter etching step is performed in accordance with the present invention. After the anisotropic etching step, resist layer 14 is removed. Integrated circuit structure 10 is then subjected to a high pressure sputter etching process.

Traditionally, a low pressure sputter etching process is used for removing a native oxide formed on the surfaces of the exposed portions of the underlying metal. Contact resistance between the underlying and subsequently applied interconnect layers is thereby minimized. Conventional sputter etching uses an inert, relatively large molecule such as argon to prevent undesirable chemical reactions with interconnect traces 11 and 21.

Sputter etching is characterized by a certain portion of sputtered material being reflected back and redepositing on integrated circuit structure 10. The redepositing reduces the overall efficiency of the sputtering step. In order to achieve a high sputter etching efficiency, conventional methods sputter etch at low pressure, typically between one microTorr and ten microTorrs. Such a low pressure produces a nearly collision-free, long mean free path for sputtered silicon dioxide molecules which minimizes any sputtered silicon dioxide from being reflected back onto integrated circuit structure 10. Sputtering efficiency and oxide removal are thereby optimized.

Figure 6:
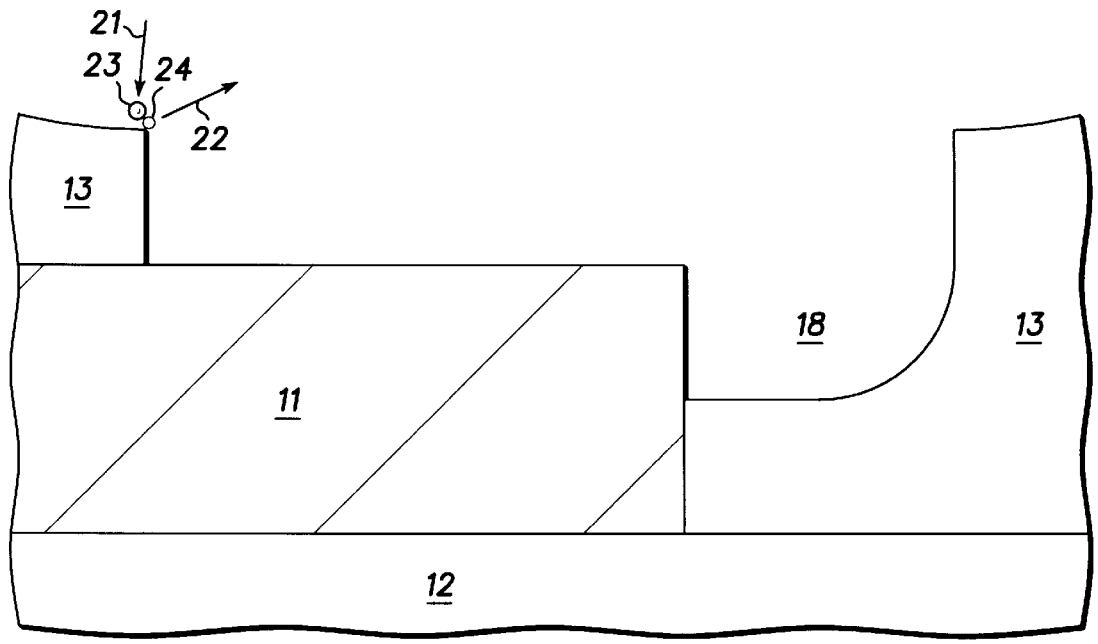
FIG. 6 is a cross-sectional view of a detail of the via opening during a sputter etch in accordance with the prior art.

Referring to FIG. 6, a cross-sectional view of a detail of the via opening is shown during a low pressure sputter etch in accordance with the prior art. A dielectric layer 13 which is formed over a substrate 12 and an interconnect trace 11 has a void 18 adjacent to a side of interconnect trace 11. An ionized argon molecule 23, accelerating toward integrated circuit structure 10 in a path 21, collides with a surface of dielectric layer 13 and causes a silicon dioxide molecule 24 to be released from dielectric layer 13. With conventional low pressure sputtering, few argon molecules are in a path between silicon dioxide molecule 24 and the vacuum source of the sputtering chamber. As a result, released silicon dioxide molecule 24 has a nearly collision-free path 22 to the vacuum source, where it is evacuated from the sputtering chamber.

Figure 7:
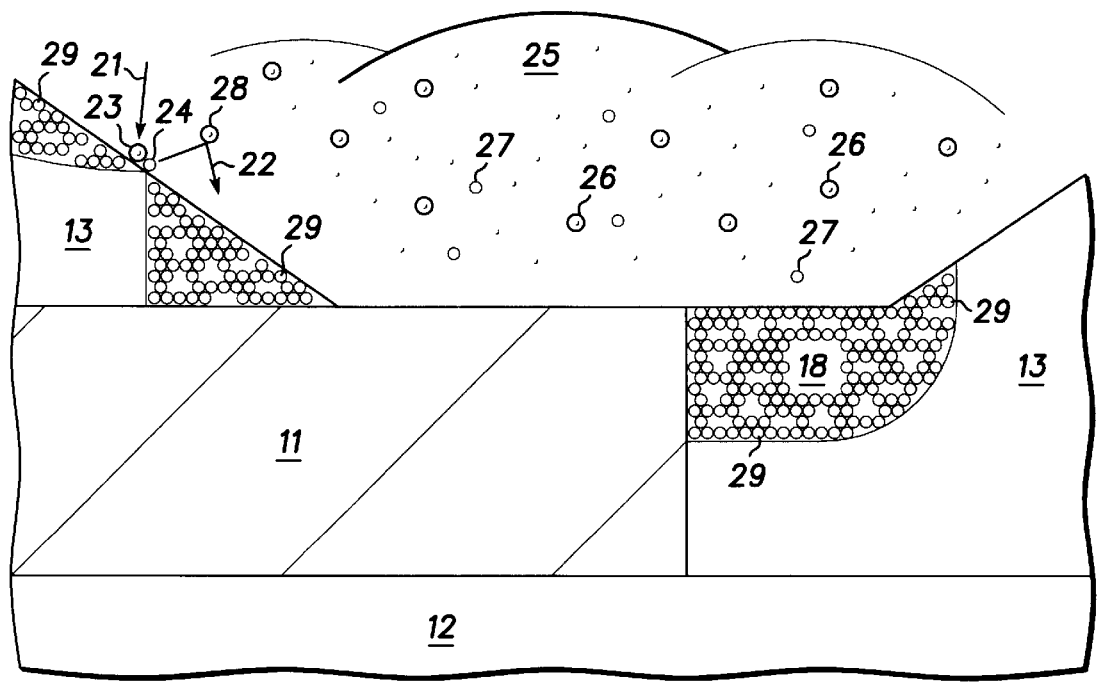
FIG. 7 is a cross-sectional view of a detail of the via opening during a high pressure sputter etch in accordance with the present invention.

Like the previously known methods, the present invention uses argon as the sputtering gas. However, the present invention improves on the prior art by sputter etching at a high pressure rather than a low pressure, thereby reducing the mean free path of sputtered molecules. Referring to FIG. 7, a cross-section of a detail of the via opening is shown during a high pressure sputter etch in accordance with the present invention. A dielectric layer 13 formed over a substrate 12 and an interconnect trace 11 has a void 18 adjacent to a side of interconnect trace 11. An argon molecule 23 collides with dielectric layer 13 in a path 21 such that a silicon dioxide molecule 24 is released. In contrast with low pressure sputtering, high pressure sputtering is characterized by a high gaseous molecular density which causes a mixture of ionized argon molecules 26 and released silicon dioxide molecules 27 to form a gaseous cloud 25 in the via opening. Cloud 25 is formed because of the high concentration of argon molecules between released silicon dioxide molecule 24 and the vacuum source. A released silicon dioxide molecule 24 takes a path 22 in which it is likely to collide with a molecule 28 in cloud 25 and to be reflected back into the via opening.

Etching rates decrease at lower depths of the via opening because dielectric layer 13 serves to shield the sputtering molecules from reaching the lower portions of the via opening to free oxide molecules. Interconnect trace 11 provides additional shielding for void 18, so that void 18 has essentially no material removed from its surfaces. Reflected silicon dioxide molecules 27 remain part of cloud 25 until they come in contact with, and are thereby redeposited on, a surface in the via opening. In contrast with the variations in etching rates in different portions of the via opening, random molecular motion in cloud 25 results in the deposition rate being uniform throughout the via opening. Thus, there is an increasing net deposition of material at greater depths of the via opening. The net deposition results in redeposited silicon dioxide molecules 29 tapering the sidewalls toward the bottom of the via opening. Net deposition is highest in voids 18, which are thus filled with redeposited silicon dioxide molecules 29.

Referring back to FIG. 5, the redeposition rate thus increases because an atmosphere rich in silicon dioxide forms in the via opening. The rate of redeposition corresponds to the pressure inside the sputtering chamber and is essentially independent of the localized sputtering rate. In one embodiment, pressure in the sputtering chamber is set such that with respect to the horizontal surfaces of dielectric layer 13, the removal and redeposition rates are substantially equal. Thus, no change in the thickness of dielectric layer 13 occurs on the horizontal surfaces. A pressure between on-half Torr and two Torrs is typically adequate to achieve the equilibrium condition.

The new surface profile is determined by the angular dependence of sputter etching. For silicon dioxide, for example, the sputter etch rate reaches a maximum at approximately a 45 degree angle. On some surfaces, such as sloped or beveled surfaces, sputter etching rates are higher than redeposition rates so there is a net removal of material from these surfaces. Referring back to FIG. 4, the sloped surface of upper portion 16 is thus etched at a higher rate than the horizontal surface of dielectric layer 13, so there is a net removal of silicon dioxide from upper portion 16. Vertical surfaces such as the vertical sidewalls of vertical portions 17 are etched at a slower rate because the ion energy on vertical walls is insufficient to cause the removal of material. Thus, there is a net redeposition of silicon dioxide on the sidewalls of vertical portion 17. Because silicon dioxide redeposition is essentially constant throughout the via opening, the silicon dioxide which was removed from the surfaces of upper portion 16 is built up on the sidewalls of vertical portion 17, thereby smoothing the contour of the via opening. Because material is redeposited, the time needed for smoothing vertical portions 17 is substantially reduced with the present invention when compared with conventional methods.

Voids 18 are shielded from the sputtering molecules because of their location at the bottom of the via opening. Therefore, sputtering removes essentially no material from the surfaces of voids 18. However, they are not shielded from oxide redeposition, which occurs randomly, so the net buildup of oxide is the highest in voids 18 such that they are filled with redeposited dielectric material. The high pressure sputter etching step of the present invention thus improves on prior methods by filling voids 18 with material removed from a different portion of dielectric layer 13 without requiring complex CVD processing and without using a titanium wetting agent with high pressure extrusion of the subsequent interconnect metal in the voids 18. Because voids 18 are filled with redeposited oxide, the high pressure sputter etching step is suitable for fabricating both landed and non-landed vias.

Returning to FIG. 5, in contrast to low pressure sputter etching, the high pressure sputter etching step causes a small amount of silicon dioxide to be redeposited on the upper surfaces of interconnect traces 11. In addition, redeposited silicon dioxide on sidewalls 19 at the surface of interconnect traces 11 and 21 reduces the effective area for contacting the subsequent interconnect layer. These effects are countered by subjecting the via opening to a final anisotropic etch for clearing out a portion of the redeposited silicon dioxide. The portion of silicon dioxide which has been redeposited typically has a lower density than other portions of dielectric layer 13, so the final anisotropic etch is brief, say from five to ten seconds. After this anisotropic etch step is completed, redeposited silicon dioxide regions 20 remain in the via opening to fill voids 18 and to smooth the contours of sidewalls 19. The final anisotropic etch is typically a reactive ion etch using a fluorine-based etchant such as a mixture of carbon tetrafluoride and oxygen.

By now it should be appreciated that a structure and a method for making a landed and a non-landed via have been provided which improve on the prior art by providing a more economical method for forming such vias while maintaining the reliability of integrated circuit structure 10. A smooth, tapered sidewall is obtained both inside the via structures and on the dielectric surface topography by combining an isotropic and an anisotropic etch with a novel high pressure argon sputter etch. The high pressure sputter etch improves on prior methods by providing a simpler, more economical process which automatically fills undesirable voids formed in the dielectric layer with redeposited insulating material.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, in addition to forming via openings on integrated circuits, it should be appreciated that the present invention also can be used for automatically filling voids formed during other processing steps as well. By way of example, voids can be formed under an aluminum interconnect trace during an aluminum etch step if the aluminum interconnect trace has a protective coating of titanium-tungsten formed on its surface. These voids are filled with redeposited silicon dioxide either from an existing dielectric layer or by forming a thin silicon dioxide layer over the interconnect trace and then subjecting the structure to a high pressure sputter etch.

I claim:

1. A method for manufacturing a semiconductor device, comprising the steps of:

providing the semiconductor device having a dielectric layer formed over a surface, the dielectric layer comprised of a material wherein the dielectric layer defines a via opening;

disposing the semiconductor device in an inert atmosphere at a pressure between about one-half and two torrs; and sputter etching the semiconductor device in the inert atmosphere at the pressure for removing the material from a first surface of the via opening and redepositing the material on a second surface of the via opening.

2. The method of claim 1, wherein the step of providing the semiconductor device includes forming the dielectric layer with the material comprised of silicon dioxide.

3. A method for filling a void in a via opening, comprising the steps of:

provided a semiconductor device having a substrate, an interconnect layer formed over the substrate and a dielectric layer formed over the interconnect layer and the substrate, wherein the via opening is formed in the dielectric layer to expose a portion of the interconnect layer, and the void lies adjacent to an edge of the interconnect layer;

disposing the semiconductor device in an inert atmosphere at a pressure between about one-half and two torrs; and high pressure sputter etching the dielectric layer in the inert atmosphere such that material is removed from a portion of the dielectric layer and redeposited to fill the void.

4. The method of claim 3, wherein the step of high pressure sputter etching includes etching material from a beveled surface of the via opening to fill the void.

5. The method of claim 4, wherein the step of high pressure stutter etching includes sputtering the dielectric layer with argon at a pressure such that on a horizontal surface of the dielectric layer a thickness of material removed is approximately equal to a thickness of material redeposited on the horizontal surface.

6. The method of claim 4, wherein the step of providing a semiconductor device includes forming the interconnect layer comprising a material containing aluminum.

7. The method of claim 6, wherein the step of providing a semiconductor device includes forming the dielectric layer comprised of silicon dioxide.

8. A method for forming a via, comprising the steps of:

providing a semiconductor device structure having a semiconductor substrate and an interconnect layer formed over a surface of the semiconductor substrate;

forming a dielectric layer over the interconnect layer, the dielectric layer comprised of a dielectric material;

isotropic flare etching through a thickness portion of the dielectric layer;

anisotropic etching through a remaining thickness of the dielectric layer to the interconnect layer; and applying a sputter etch to the dielectric layer in an inert atmosphere at a pressure between about one-half and two torrs for smoothing a sidewall of the via.

9. The method of claim 8, wherein the step of applying a sputter etch includes removing dielectric material from a surface of the dielectric layer and redepositing it along the sidewall of the via.

10. The method of claim 8, wherein the step of anisotropic etching produces a void adjacent to the interconnect layer and the step of applying a high pressure sputter etch includes removing dielectric material from a surface of the via and redepositing it in the void.

11. The method of claim 8, further comprising a step of applying a second anisotropic etch to the via after applying the sputter etch, for reducing contact resistance to the interconnect layer.

12. The method of claim 11, wherein the step of applying a second anisotropic etch to the via includes reactive ion etching for between five and ten seconds.

13. The method of claim 8, wherein the step of isotropic flare etching includes plasma etching the dielectric layer using a material containing fluorine.

14. The method of claim 8, wherein the step of forming a dielectric layer includes depositing silicon dioxide to a thickness of approximately 10,000 Angstroms.

15. The method of claim 14, wherein the step of isotropic flare etching includes etching the dielectric layer to a remaining oxide thickness of approximately 3,500 Angstroms.

16. The method of claim 15, wherein the step of applying a high pressure sputter etch includes maintaining a pressure of 0.5 to 2 Torr.

17. The method of claim 8, wherein the step of anisotropic etching includes reactive ion etching through a remaining thickness of the dielectric layer to the interconnect layer.

* * * * *

UNITED STATES PATENT AND TRADEMARK OFFICE
CERTIFICATE OF CORRECTION

| | |
|---|---|
| PATENT NO. | : 5,888,901 |
| DATED | : March 30, 1999 |
| INVENTOR(S) | : Gordon M. Grivna |

Page 1 of 1

It is certified that error appears in the above-identified patent and that said Letters Patent is hereby corrected as shown below:

<u>Column 7,</u>
Line 24, delete "stutter" and add -- sputter --.

Signed and Sealed this

Thirtieth Day of April, 2002

*Attest:*

*Attesting Officer*

JAMES E. ROGAN
*Director of the United States Patent and Trademark Office*